(12) United States Patent
Chen et al.

(10) Patent No.: US 8,227,927 B2
(45) Date of Patent: Jul. 24, 2012

(54) CHIP PACKAGE AND FABRICATION METHOD THEREOF

(76) Inventors: Wei-Ming Chen, Hsinchu (TW); Shu-Ming Chang, Tucheng (TW)

( * ) Notice: Subject to any disclaimer, the term of this patent is extended or adjusted under 35 U.S.C. 154(b) by 106 days.

(21) Appl. No.: 12/900,190

(22) Filed: Oct. 7, 2010

(65) Prior Publication Data
US 2011/0084382 A1   Apr. 14, 2011

Related U.S. Application Data

(60) Provisional application No. 61/249,536, filed on Oct. 7, 2009.

(51) Int. Cl.
*H01L 23/544* (2006.01)

(52) U.S. Cl. ........... 257/797; 257/E23.179; 257/723; 257/787; 438/401; 438/462; 438/975

(58) Field of Classification Search ........... 257/E21.502, 257/E23.068, E23.179, 723, 737, 773, 786, 257/787, 797; 438/112, 125, 127, 401, 462, 438/622, 761, 773, 975
See application file for complete search history.

(56) References Cited

U.S. PATENT DOCUMENTS

| | | | |
|---|---|---|---|
| 4,878,991 A * | 11/1989 | Eichelberger et al. | 216/21 |
| 5,091,769 A * | 2/1992 | Eichelberger | 257/687 |
| 5,250,843 A * | 10/1993 | Eichelberger | 257/692 |
| 6,271,469 B1 * | 8/2001 | Ma et al. | 174/521 |
| 6,396,148 B1 * | 5/2002 | Eichelberger et al. | 257/758 |
| 6,586,822 B1 * | 7/2003 | Vu et al. | 257/678 |
| 6,784,530 B2 * | 8/2004 | Sugaya et al. | 257/686 |
| 6,803,324 B2 * | 10/2004 | Ogawa et al. | 438/761 |
| 6,836,025 B2 * | 12/2004 | Fujisawa et al. | 257/782 |
| 6,972,964 B2 * | 12/2005 | Ho et al. | 361/761 |
| 7,071,024 B2 * | 7/2006 | Towle et al. | 438/106 |
| 7,129,117 B2 * | 10/2006 | Hsu | 438/112 |
| 7,339,279 B2 * | 3/2008 | Yang | 257/778 |
| 7,348,662 B2 * | 3/2008 | Miyazaki et al. | 257/679 |
| 7,511,376 B2 * | 3/2009 | Lin et al. | 257/734 |
| 7,667,318 B2 * | 2/2010 | Yang et al. | 257/700 |
| 7,799,602 B2 * | 9/2010 | Pagaila et al. | 438/106 |
| 7,868,445 B2 * | 1/2011 | Kohl et al. | 257/690 |
| 8,039,304 B2 * | 10/2011 | Pagaila | 438/107 |
| 2008/0148563 A1 * | 6/2008 | Sakamoto et al. | 29/852 |
| 2008/0284012 A1 * | 11/2008 | Okayama et al. | 257/737 |

* cited by examiner

*Primary Examiner* — Chris Chu
(74) *Attorney, Agent, or Firm* — Liu & Liu

(57) ABSTRACT

A chip package is disclosed. The package includes a carrier substrate and at least two semiconductor chips thereon. Each semiconductor chip includes a plurality of conductive pads. A position structure is disposed on the carrier substrate to fix locations of the semiconductor chips at the carrier substrate. A fill material layer is formed on the carrier substrate, covers the semiconductor chips and the position structure, and has a plurality of openings correspondingly exposing the conductive pads. A redistribution layer (RDL) is disposed on the fill material layer and is connected to the conductive pads through the plurality of openings. A protective layer covers the fill material layer and the RDL. A plurality of conductive bumps is disposed on the protective layer and is electrically connected to the RDL. A fabrication method of the chip package is also disclosed.

26 Claims, 14 Drawing Sheets

CHIP PACKAGE AND FABRICATION METHOD THEREOF

CROSS REFERENCE TO RELATED APPLICATIONS

This application claims the benefit of U.S. Provisional Application No. 61/249,536, filed Oct. 7, 2009, the entirety of which is incorporated by reference herein.

BACKGROUND OF THE INVENTION

1. Field of the Invention

The invention relates to an electronic package and more particularly to a chip package with multiple chips and a fabrication method thereof.

2. Description of the Related Art

As the demands of electronic or optoelectronic products, such as digital cameras, camera phones, bar code readers, and monitors, are increased, semiconductor technology developeds rapidly, such that there is a trend for miniaturization of the semiconductor chip size and the functionality of the semiconductor chip becomes complicated.

Therefore, more than one semiconductor chip is typically placed in the same sealed package due to performance demands, thereby being beneficial for operational stability. However, since higher precision is required for positioning multiple semiconductor chips compared to single semiconductor chip, the difficulty of semiconductor packaging is increased and thus the yield is reduced.

Accordingly, there is a need to develop a novel package structure without the above problems.

BRIEF SUMMARY OF THE INVENTION

An embodiment of a chip package comprises a carrier substrate. At least two semiconductor chips are disposed on the carrier substrate, wherein each semiconductor chip comprises a plurality of conductive pads. A position structure is disposed on the carrier substrate to fix locations of the semiconductor chips at the carrier substrate. A fill material layer is formed on the carrier substrate and covers the semiconductor chips and the position structure, wherein the fill material layer has a plurality of first openings correspondingly exposing the plurality of conductive pads. A first redistribution layer is disposed on the fill material layer and is electrically connected to the plurality of conductive pads through the plurality of first openings. A protective layer covers the fill material layer and the first redistribution layer. A plurality of conductive bumps is disposed on the protective layer and is electrically connected to the first redistribution layer.

Another embodiment of a chip package comprises a first semiconductor chip comprising a plurality of first conductive pads. At least one second semiconductor chip is disposed on the first semiconductor chip, wherein the second semiconductor chip comprises a plurality of second conductive pads. A position structure is disposed on the first semiconductor chip to fix location of the second semiconductor chip at the first semiconductor chip. A first redistribution layer is disposed on the first semiconductor chip and is electrically connected to the plurality of first conductive pads. A fill material layer is formed on the first semiconductor chip and covers the second semiconductor chip, the position structure, and the first redistribution layer, wherein the fill material layer has a plurality of first openings correspondingly exposing the plurality of second conductive pads and has a plurality of second openings correspondingly exposing portions of the first redistribution layer. A second redistribution layer is disposed on the fill material layer, electrically connected to the plurality of second conductive pads through the plurality of first openings, and electrically connected to the first redistribution layer through the plurality of second openings. A protective layer covers the fill material layer and the second redistribution layer. A plurality of conductive bumps is disposed on the protective layer and is electrically connected to the second redistribution layer.

An embodiment of a method for fabricating a chip package comprises providing a carrier substrate. A position structure is formed on the carrier substrate. At least two semiconductor chips are provided on the carrier substrate and locations of the semiconductor chips at the carrier substrate are fixed through the position structure, wherein each semiconductor chip comprises a plurality of conductive pads. A fill material layer is formed on the carrier substrate to cover the semiconductor chip and the position structure, wherein the fill material layer has a plurality of first opening correspondingly exposing the plurality of conductive pads. A first redistribution layer is formed on the fill material layer, such that the first redistribution layer is electrically connected to the plurality of conductive pads through the plurality of first openings. The fill material layer and the first redistribution layer are covered by a protective layer. A plurality of conductive bumps is formed on the protective layer to be electrically connected to the first redistribution layer.

Another embodiment of a method for fabricating a chip package comprises providing a first semiconductor chip comprising a plurality of first conductive pads. A position structure and a first redistribution layer are formed on the first semiconductor chip, wherein the first redistribution layer is electrically connected to the plurality of first conductive pads. At least one second semiconductor chip is provided on the first semiconductor chip to fix a location of the second semiconductor chip at the first semiconductor chip through the position structure, wherein the second semiconductor chip comprises a plurality of second conductive pads. A fill material layer is formed on the first semiconductor chip to cover the second semiconductor chip, the position structure, and the first redistribution layer, wherein the fill material layer has a plurality of first openings correspondingly exposing the plurality of second conductive pads and has a plurality of second openings correspondingly exposing portions of the first redistribution layer. A second redistribution layer is formed on the fill material layer, such that the second redistribution layer is electrically connected to the plurality of second conductive pads through the plurality of first openings and is electrically connected to the first redistribution layer through the plurality of second openings. The fill material layer and the second redistribution layer are covered by a protective layer. A plurality of conductive bumps is formed on the protective layer to be electrically connected to the second redistribution layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the fabrication and the use of carrying out the invention. It can be understood that this description is provided for the purpose of illustrating the fabrication and the use of the invention and should not be taken in a limiting sense.

Figure 1:
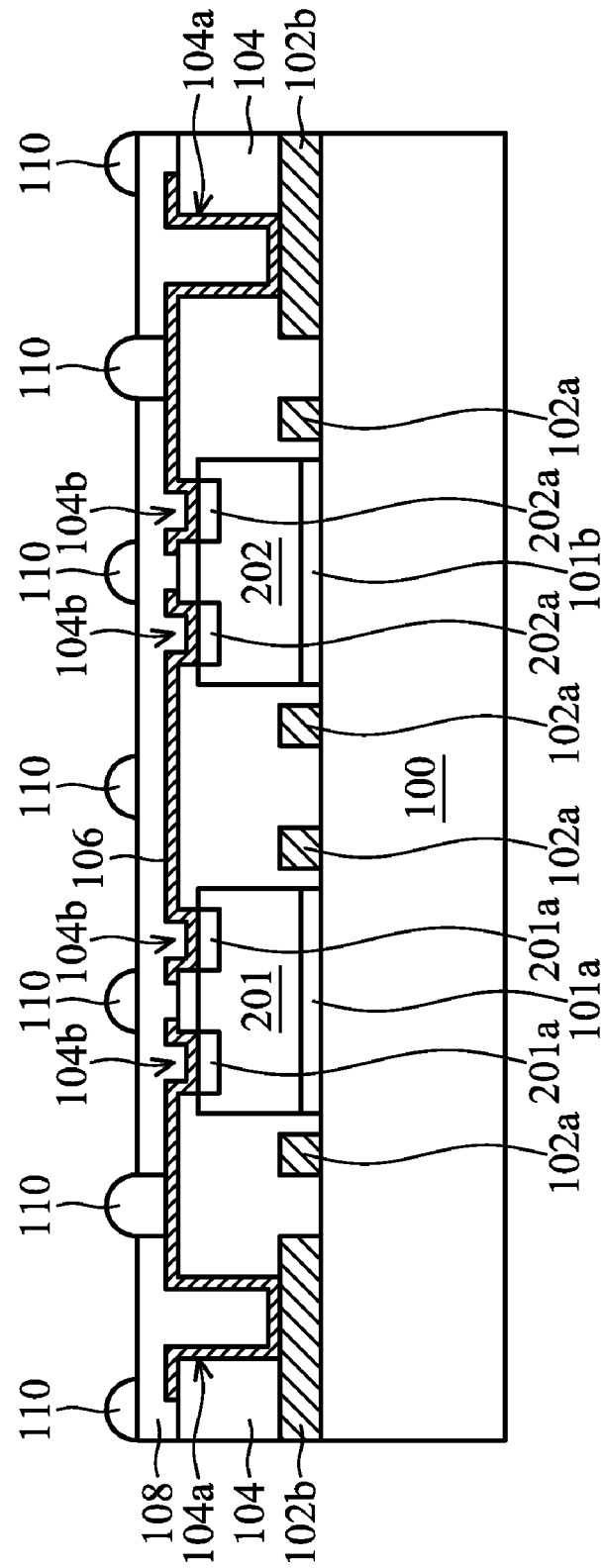
FIGS. 1 to 3 are cross sections of various exemplary embodiments of a chip package according to the invention.
Figure 2:
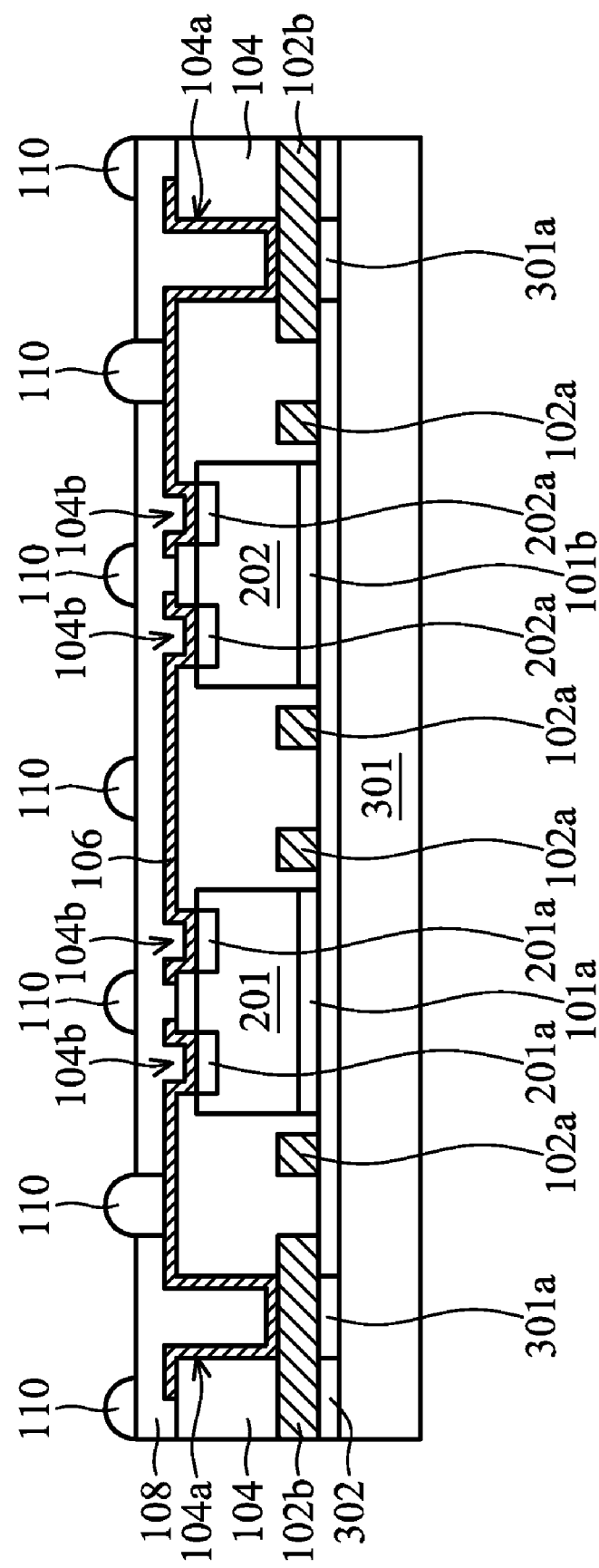
Figure 3:
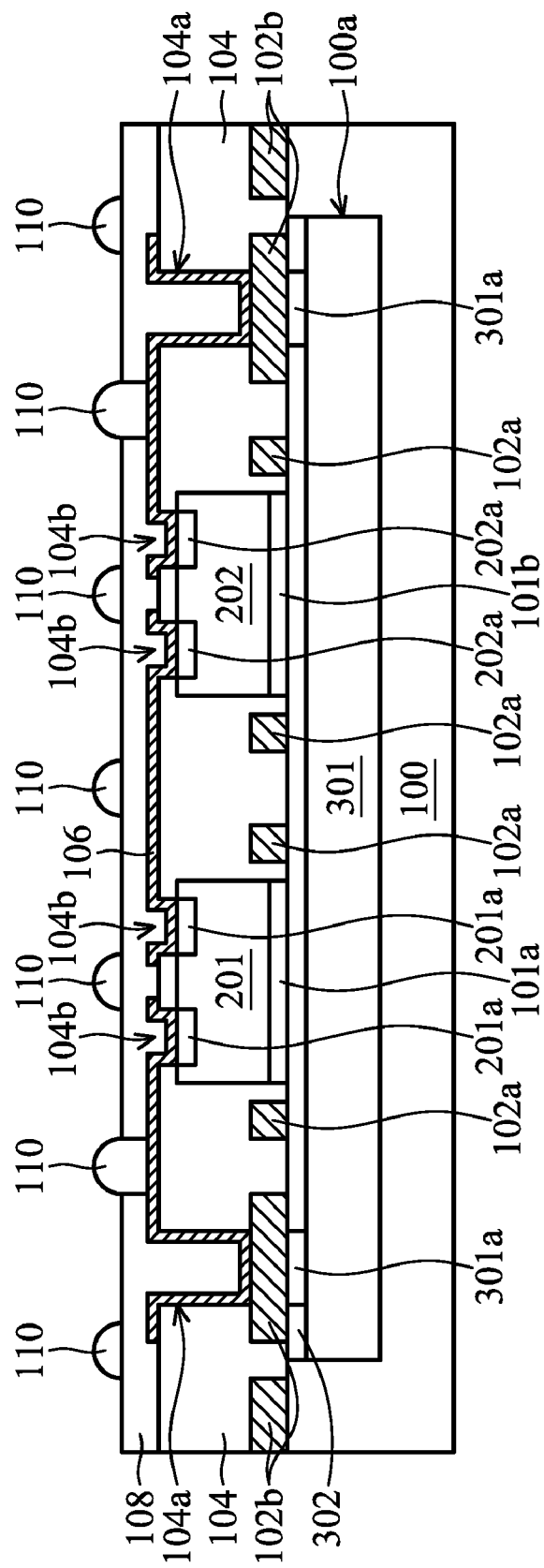

Referring to FIGS. 1 to 3, which are cross sections of various exemplary embodiments of a chip package according to the invention. In the embodiments, the chip package may be applied in various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer level package (WLP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

A wafer level package process involving electronic devices is first packaged at the wafer level and then diced into individual packages. However, in a specific embodiment, separate semiconductor chips may be, for example, redistributed on a carrier wafer for a subsequent packaging process, which may be called a wafer level package process. In addition, a stacking process may also be used in the wafer level package process mentioned above to stack a plurality of wafers having integrated circuits to form electronic device packages of multi-layered integrated circuit devices.

Referring to FIG. 1, the chip package comprises a carrier substrate 100. For example, the carrier substrate 100, which can be used for placing semiconductor chips, is provided by dicing a raw silicon wafer or other semiconductor substrate without including circuits. In the embodiment, at least two semiconductor chips 201 and 202 are disposed on the carrier substrate 100 through adhesion layers 101a and 101b. Moreover, the semiconductor chips 201 and 202 comprise pluralities of conductive pads 201a and 202a, respectively.

A position structure 102a and a redistribution layer 102b are disposed on the carrier substrate 100, in which the position structure 102a is adjacent to or slightly contacts the semiconductor chips 201 and 202 to serve as a shifting stopper, thereby fixing locations of the semiconductor chips 201 and 202 at the carrier substrate 100. In one embodiment, the position structure 102a may comprise opaque insulating material or metal and serve as an alignment mark (AM) for placing the semiconductor chips 201 and 202. In particular, the position structure 102a and the redistribution layer 102b may be formed of the same metal layer to simultaneously serve as a stress buffer layer. In some embodiments, the position structure 102a may also comprise transparent insulating material.

A fill material layer 104, such as a dry film or other polymer material, is formed on the carrier substrate 100 and covers the semiconductor chips 201 and 202, the position structure 102a, and the redistribution layer 102b. The fill material layer 104 has a plurality of openings 104a exposing portions of the redistribution layer 102b and has a plurality of openings exposing the plurality of conductive pads 201a of the semiconductor chip 201 and the plurality of conductive pads 202a of the semiconductor chip 202.

A redistribution layer 106, such as a fan-out type redistribution layer, is disposed on the fill material layer 104, is electrically connected to the redistribution layer 102b through the plurality of openings 104a, and is electrically connected to the pluralities of conductive pads 201a and 202a of the semiconductor chips 201 and 202 through the plurality of openings 104b.

A protective layer 108, such as a solder mask, covers the fill material layer 104 and the redistribution layer 106. The protective layer 108 has a plurality of openings exposing portions of the underlying redistribution layer 106 corresponding thereto. A plurality of conductive bumps 110 is correspondingly disposed to the plurality of openings in the protective layer 108 so as to be electrically connected to the corresponding redistribution layer 106.

Referring to FIG. 2, elements in FIG. 2 that are the same as those in FIG. 1 are labeled with the same reference numbers as in FIG. 1 and are not described again for brevity. Unlike the embodiment shown in FIG. 1, at least one semiconductor chip is placed on another semiconductor chip to form a stack structure with multiple chips. For example, semiconductor chips 201 and 202 are disposed on an insulating layer 302 of a semiconductor chip 301 through adhesion layers 101a and 101b, respectively. Also, the semiconductor chip 301 may comprise a plurality of conductive pads 301a embedded in the insulting layer 302. Moreover, a position structure 102a and a redistribution layer 102b are disposed on the semiconductor chip 301, in which the redistribution layer 102b is electrically connected to the plurality of conductive pads 301a of the semiconductor chip 301.

Referring to FIG. 3, elements in FIG. 3 that are the same as those in FIGS. 1 and 2 are labeled with the same reference numbers as in FIGS. 1 and 2 and are not described again for brevity. Unlike the embodiments shown in FIGS. 1 and 2, a carrier substrate 100 has a cavity 100a on a surface thereof. The cavity 100a serves as a position structure, such that the semiconductor chip 301 is self-aligned and embedded into the cavity 100a of the carrier substrate 100.

Figure 4A:
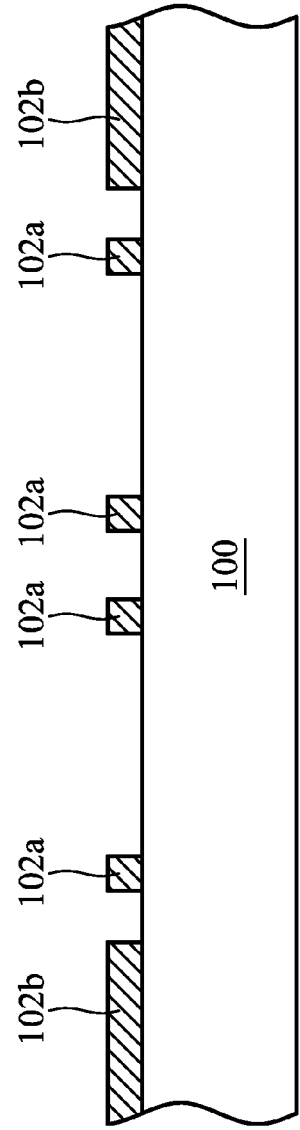
FIGS. 4A to 4E are cross sections of an exemplary embodiment of a method for fabricating a chip package according to the invention.

Referring to FIGS. 4A to 4E, which illustrate an exemplary embodiment of a method for fabricating chip package according to the invention. In FIG. 4A, a carrier substrate 100, such as a raw silicon wafer or other semiconductor substrate without including circuits, is provided. The carrier substrate 100 has a plurality of chip carried regions (not shown) to correspondingly place the semiconductor chip in each chip carried region. Next, a metal layer (not shown) is deposited on the carrier substrate 100. Thereafter, the metal layer is patterned by conventional lithography and etching processes to form a position structure 102a and a redistribution layer 102b on the carrier substrate 100. The position structure 102a is used as a shifting stopper and an alignment mark for the subsequent alignment of semiconductor chips and for fixing locations of the semiconductor chips at the carrier substrate 100. In the embodiment, since the position structure 102a and the redistribution layer 102b are formed of the same metal layer, both of then may simultaneously serve as a stress buffer layer and the fabricating steps can be simplified. In some embodiments, the position structure 102a may also comprise transparent or opaque insulating material and the redistribution layer 102b may comprise metal.

Figure 6B:
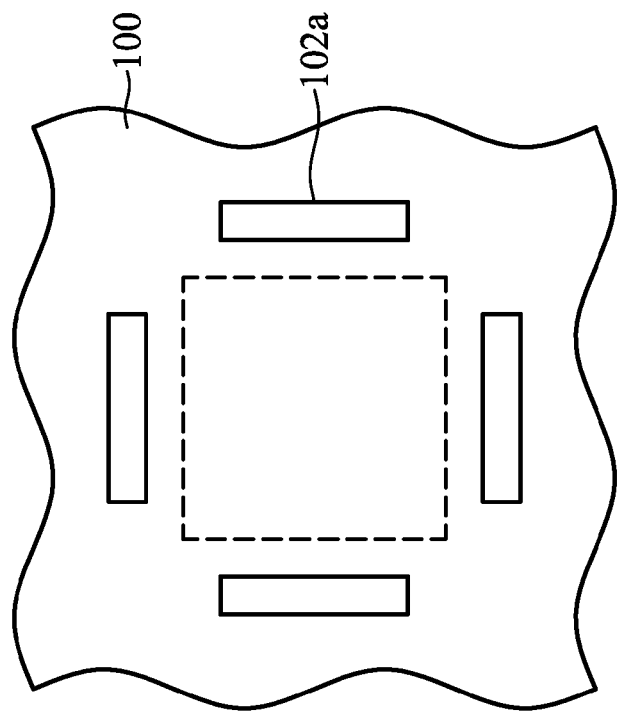
FIGS. 6A to 6D are plan view of various exemplary embodiments of a position structure according to the invention.
Figure 6A:
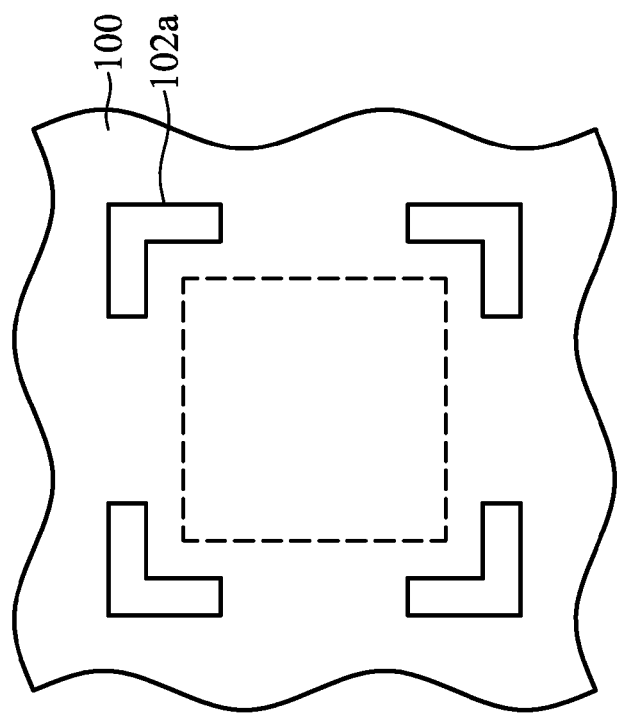

FIGS. 6A to 6D illustrate various exemplary embodiments of a position structure according to the invention. Elements in FIGS. 6A to 6D that are the same as those in FIG. 1 are labeled with the same reference numbers as in FIG. 1 and are not described again for brevity. In one embodiment, the position structure 102a comprises at least two islands which are adjacent to at least two opposite corners of the corresponding chip carried region (as shown by the dash region), respectively. For example, the islands of the position structure 102a are L-shaped as viewed from top view perspective and adjacent to four corners of the chip carried region, as shown in FIG. 6A, thereby serving as an alignment mark and/or a chip shifting stopper for subsequent semiconductor chip bonding process.

Figure 6D:
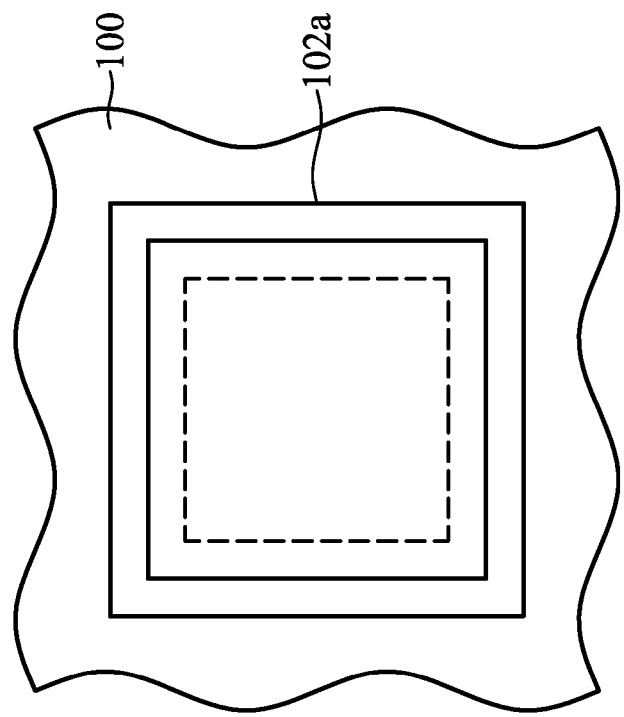
Figure 6C:
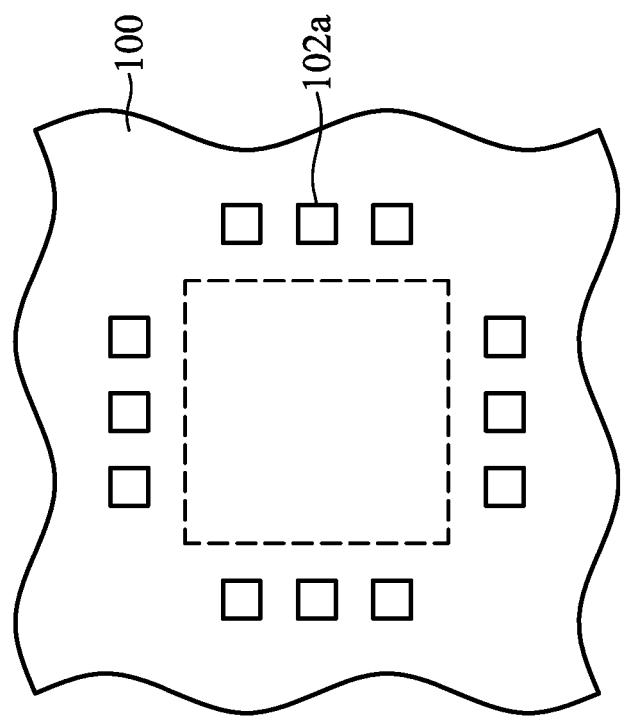

In another embodiment, the position structure 102a comprises at least two islands adjacent to at least two opposite sides or adjacent sides of the corresponding chip carried region, respectively. For example, as shown in FIGS. 6B and 6C, the islands of the position structure 102a are rectangular or square as viewed from top view perspective, adjacent to and surrounding all sides of the corresponding chip carried region. In another embodiment, the position structure 102a may be a ring surrounding the corresponding chip carried region, as shown in FIG. 6D.

Figure 4B:
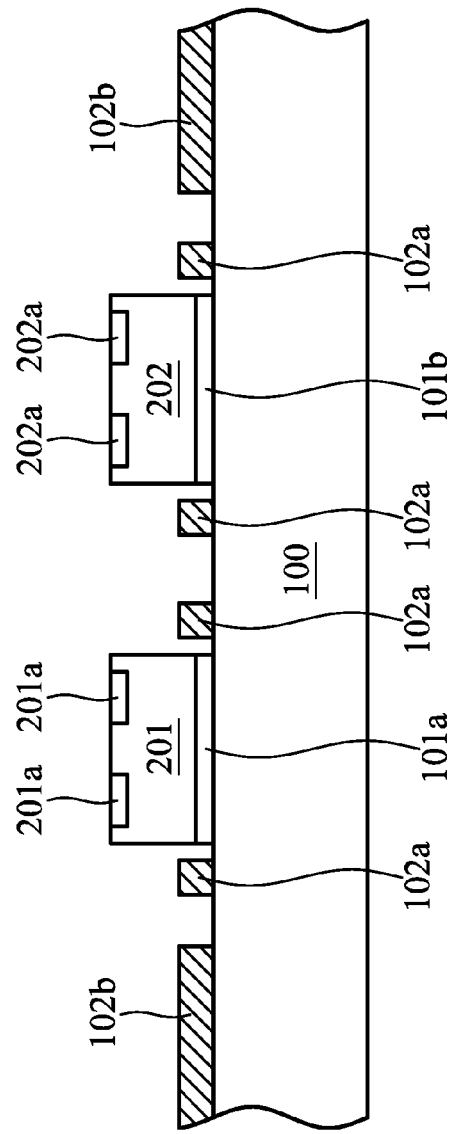

Referring to FIG. 4B, at least two semiconductor chips 201 and 202 comprising pluralities of conductive pads 201a and 201b, respectively, are provided. Next, the semiconductor chips 201 and 202 are adhered onto the carrier substrate 100 in the chip carried regions (as the dash region shown in FIGS. 6A to 6D) by adhesion layers 101a and 101b. The adhesion layers 201 and 202 may cause shift of the semiconductor chips 201 and 202 before curing the adhesion layers 201 and 202, resulting in misalignment in subsequent processes. Accordingly, the shift of the semiconductor chips 201 and 202 is controlled within an allowable tolerance by forming the position structure 102a adjacent to or slightly contacting the semiconductor chips 201 and 202. In another embodiment, the position structure 102a may also serve as an alignment mark, such that the semiconductor chips 201 and 202 can be precisely disposed on the carrier substrate 100.

Figure 4C:
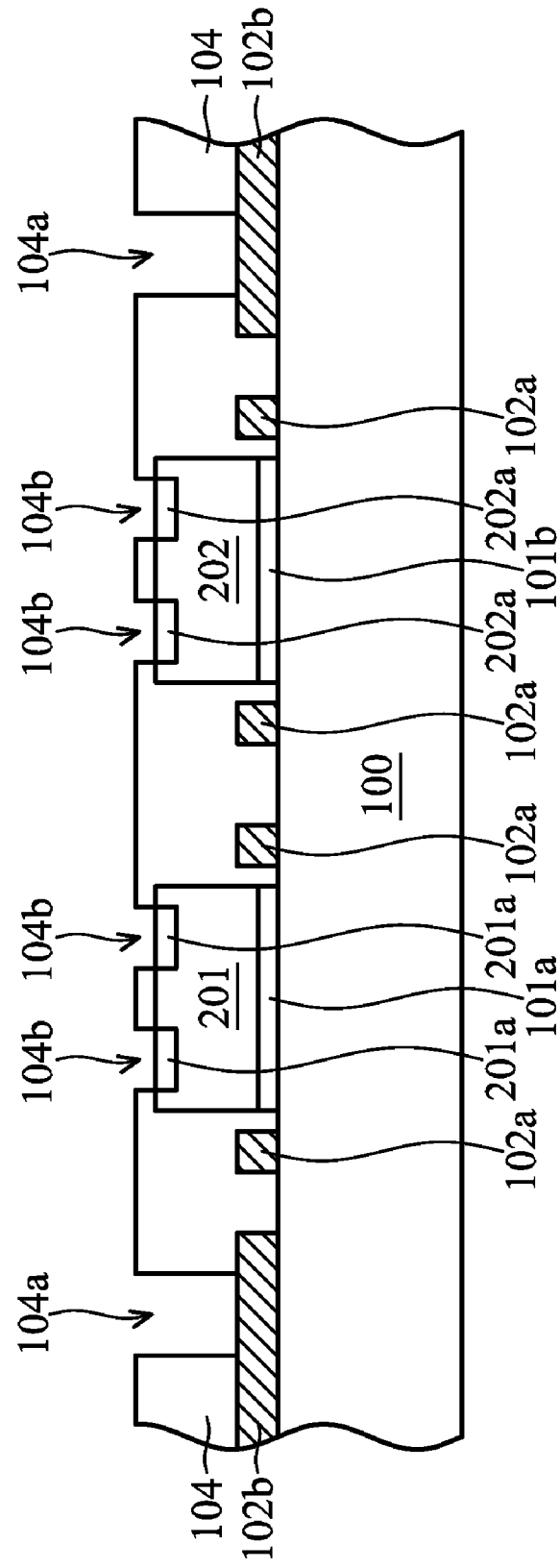

Referring to FIG. 4C, a fill material layer 104, such as a dry film or other polymer material, is formed on the carrier substrate 100 to cover the semiconductor chips 201 and 202, the position structure 102a, and the redistribution layer 102b. Since the fill material layer 104 may induce compressive stress when it is curried, the position structure 102a and the redistribution layer 102b may serve as a buffer layer to reduce the stress induced by the fill material layer 104, thereby ensuring process stability. Next, a plurality of openings 104a exposing portions of the redistribution layer 102b and a plurality of openings 104b exposing the pluralities of conductive pads 201a and 202a of the semiconductor chips 201 and 202, respectively, are formed in the fill material layer 104 by conventional lithography and etching processes.

Figure 4D:
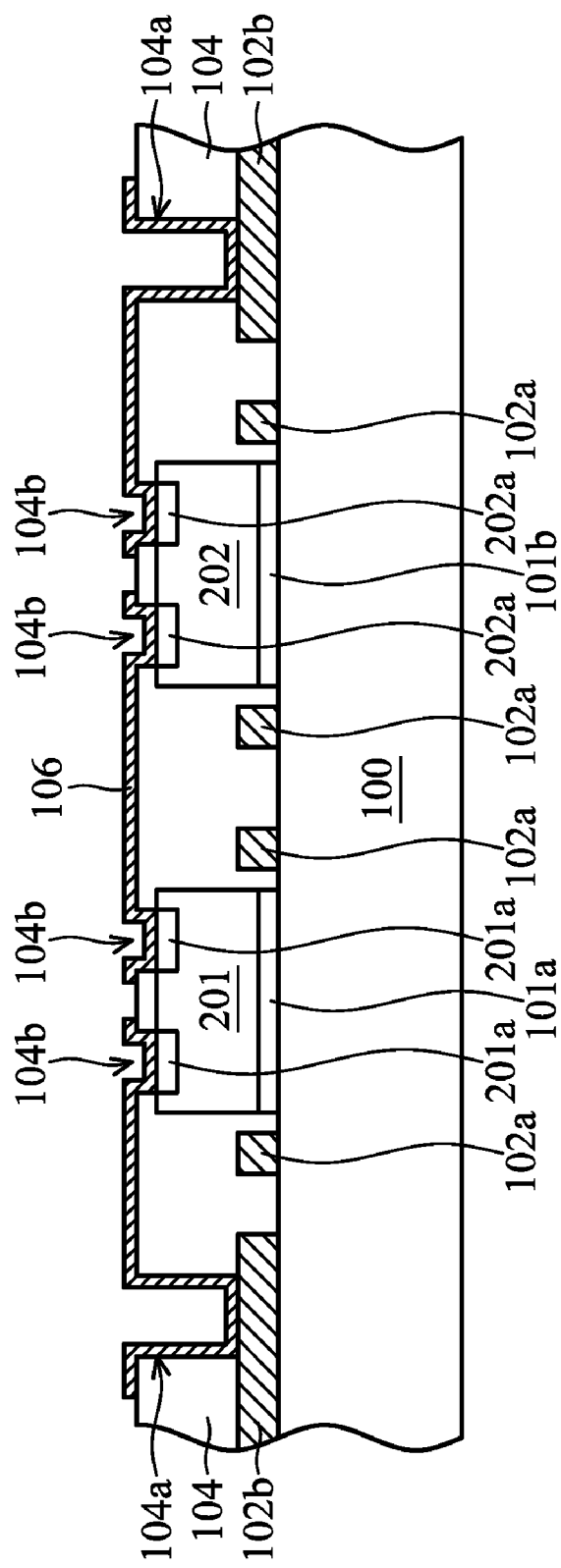

Referring to FIG. 4D, a fan-out type redistribution layer 106 is formed on the fill material layer 104, is electrically connected to the redistribution layer 102b through the plurality of openings 104a in the fill material layer 104, and is electrically connected to the pluralities of conductive pads 201a and 202a of the semiconductor chips 201 and 202 through the plurality of openings 104b. The redistribution layer 106 may comprise aluminum, copper or other wire material well known in the art and be formed by conventional deposition, such as plating, electroless plating or physical vapor deposition.

Figure 4E:
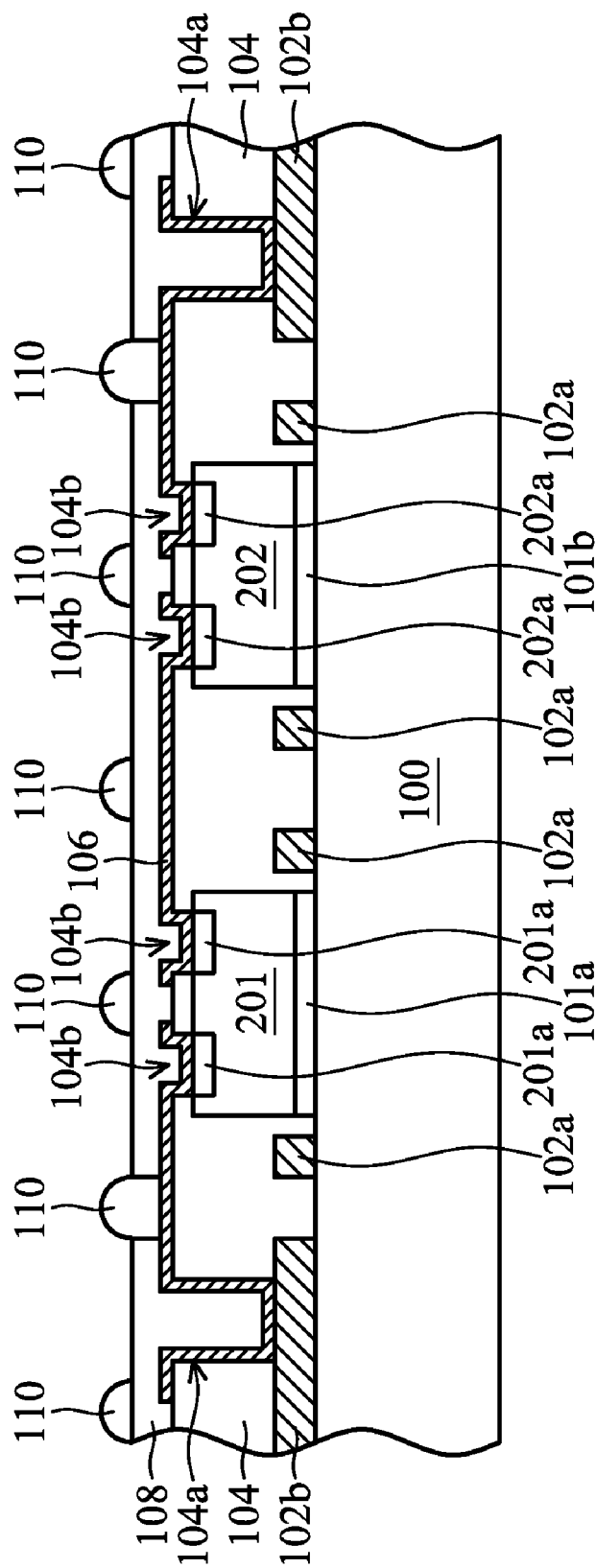

Referring to FIG. 4E, the fill material layer 104 and the redistribution layer 106 are covered by a protective layer 108, such as a solder mask. Next, a plurality of openings is formed in the protective layer 108 by conventional lithography and etching processes to expose the underlying portions of the redistribution layer 106 corresponding thereto. Next, a plurality of conductive bumps 110 is correspondingly formed in the plurality of openings in the protective layer 108, such that the plurality of conductive bumps 110 is electrically connected to the semiconductor chips 201 and 202 through the redistribution layer 106. In one embodiment, under bump metallization layers may be formed on the exposed portions of the redistribution layer 106 prior to formation of the plurality of conductive bumps 110.

Thereafter, the carrier substrate 100 may be polished to a desired thickness and then the carrier substrate 100 and the overlying fill material and protective layers 104 and 108 are diced to form individual chip packages, as shown in FIG. 1.

Figure 5A:
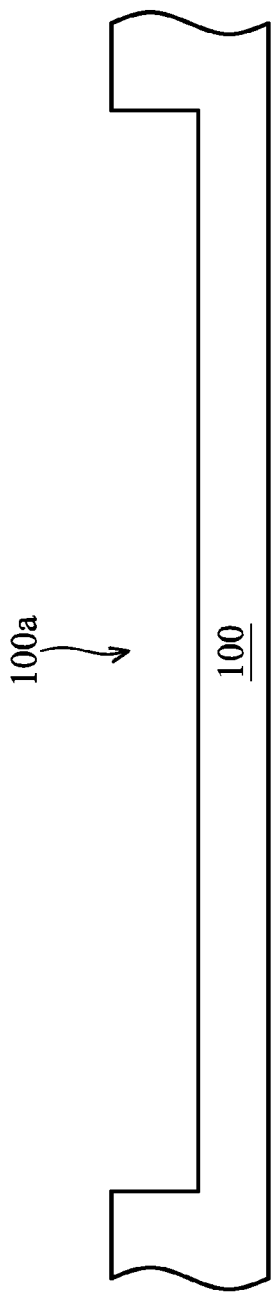
FIGS. 5A to 5F are cross sections of another exemplary embodiment of a method for fabricating a chip package according to the invention.

Referring to FIGS. 5A to 5F, which illustrate another exemplary embodiment of a method for fabricating chip package according to the invention. Elements in FIGS. 5A to 5F that are the same as those in FIGS. 4A and 4E are labeled with the same reference numbers as in FIGS. 4A and 4E and are not described again for brevity. In FIG. 5A, a carrier substrate 100 is provided. In the embodiment, the carrier substrate 100 has a cavity 100a on a surface thereof. The cavity 100a serves as a position structure, such that the subsequent semiconductor chip can be self-aligned and embedded into the cavity 100a of the carrier substrate 100.

Figure 5B:
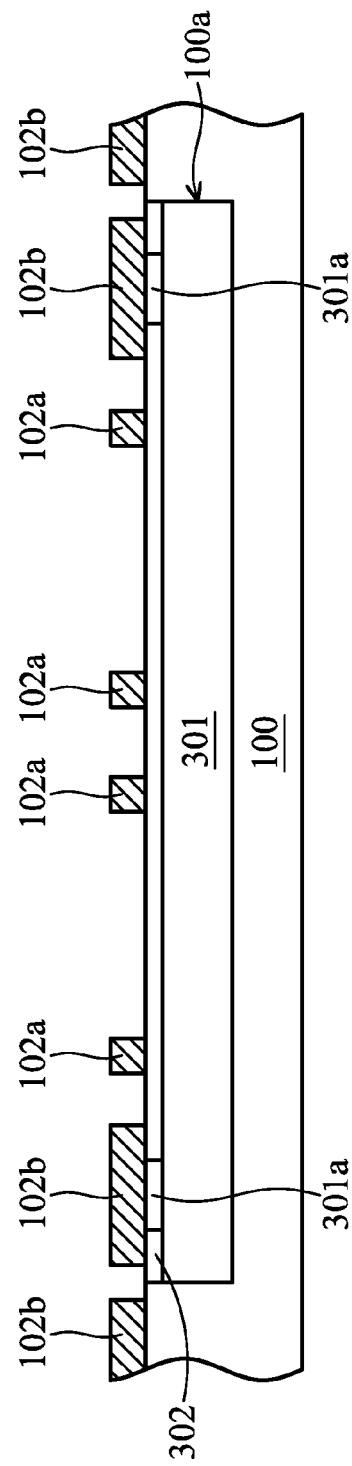

Referring to FIG. 5B, a semiconductor chip 301 having an insulating layer 302 on a surface thereof is provided. The surface of the insulating layer 302 has at least one chip carried region for placement of the semiconductor chip. Moreover, the semiconductor chip 301 comprises a plurality of conductive pads 301a embedded into the insulating layer 302. Next, a metal layer (not shown) is deposited on the carrier substrate 100. Thereafter, the metal layer is patterned by conventional lithography and etching processes to form a position structure 102a and a redistribution layer 102b on the semiconductor chip 301. In the embodiment, the redistribution layer 102b may extend to the carrier substrate 100 outside of the semiconductor chip 301. Moreover, the redistribution layer 102b is electrically connected to the plurality of conductive pads 301a of the semiconductor chip 301. Additionally, the position structure 102a may comprise at least two islands which are adjacent to at least two opposite corners of the corresponding chip carried region, respectively. In another embodiment, the position structure 102a may comprise at least two islands adjacent to at least two opposite sides or adjacent sides of the corresponding chip carried region, respectively. In another embodiment, the position structure 102a may be a ring surrounding the corresponding chip carried region, as shown in FIG. 6D.

Figure 5C:
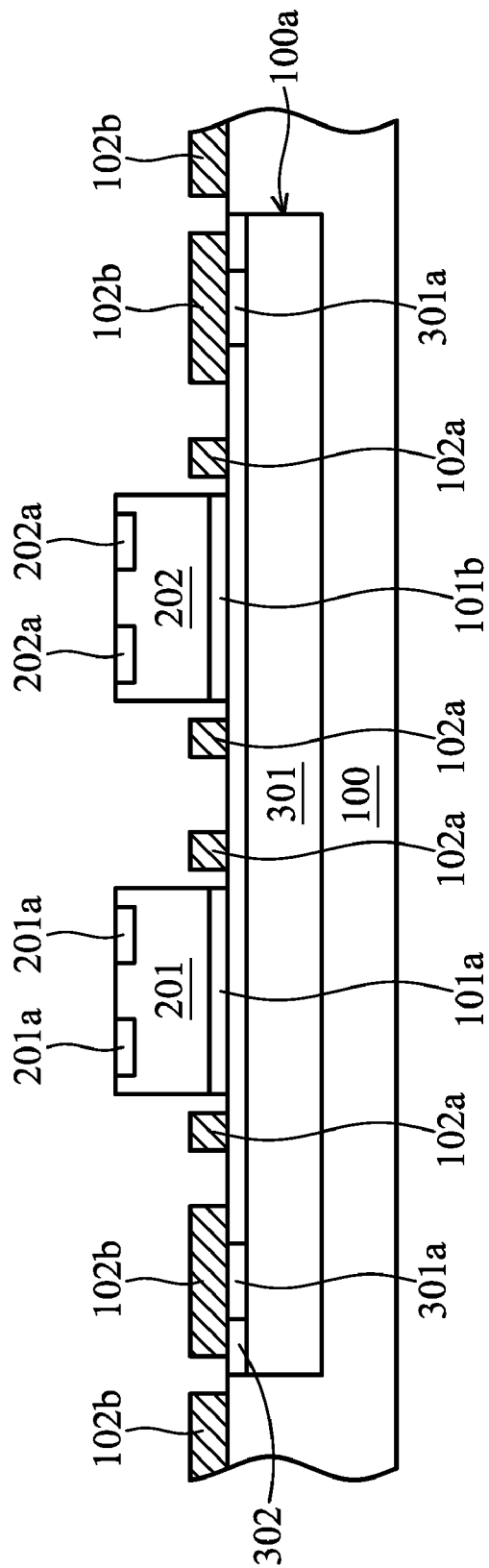

Referring to FIG. 5C, at least one semiconductor chip is provided on the semiconductor chip 301. For example, semiconductor chips 201 and 202 are provided. The semiconductor chips 201 and 202 are adhered onto the insulating layer 302 of the semiconductor chip 301 by conductive adhesion layers 101a and 101b. At the same time, the position structure 102a on the insulating layer 302 fixes the locations of the semiconductor chips 201 and 202 at the semiconductor chip 301.

Figure 5D:
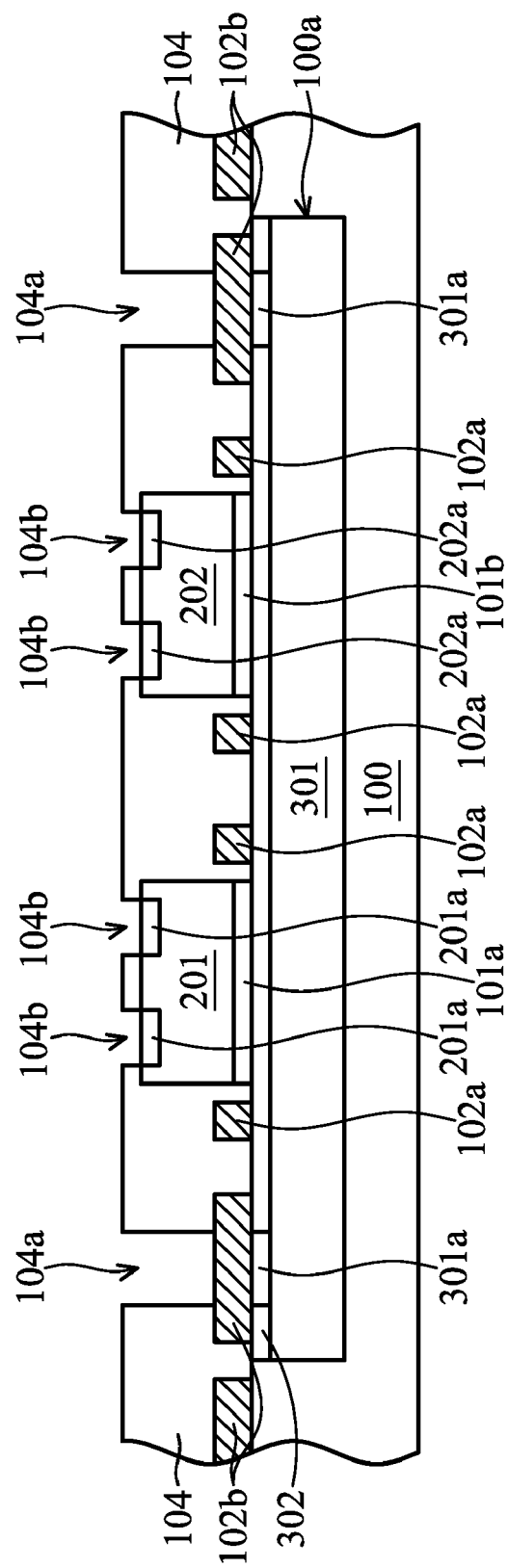

Referring to FIG. 5D, a fill material layer 104 is formed on the carrier substrate 100 to cover the semiconductor chips 201, 202 and 301, the position structure 102a, and the redistribution layer 102b. Next, pluralities of openings 104a and 104b are formed in the fill material layer 104 by conventional lithography and etching processes.

Figure 5E:
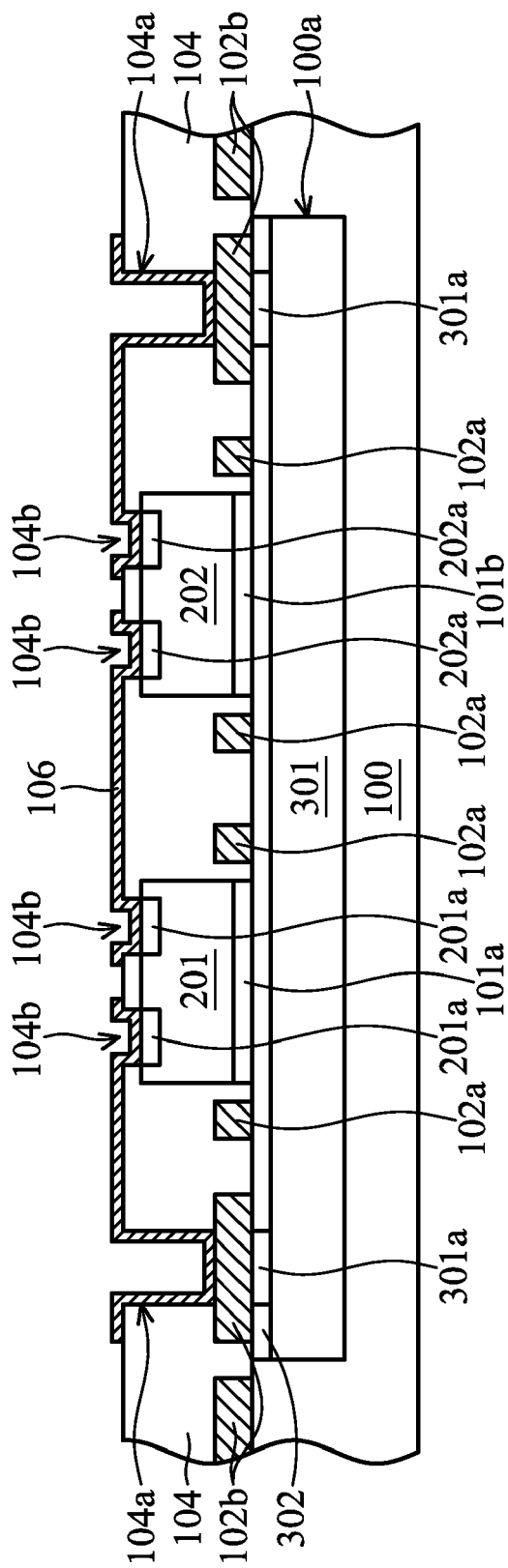

Referring to FIG. 5E, a fan-out type redistribution layer 106 is formed on the fill material layer 104, electrically connected to the redistribution layer 102b through the plurality of openings 104a in the fill material layer 104, and electrically connected to the pluralities of conductive pads 201a and 202a of the semiconductor chips 201 and 202 through the plurality of openings 104b.

Figure 5F:
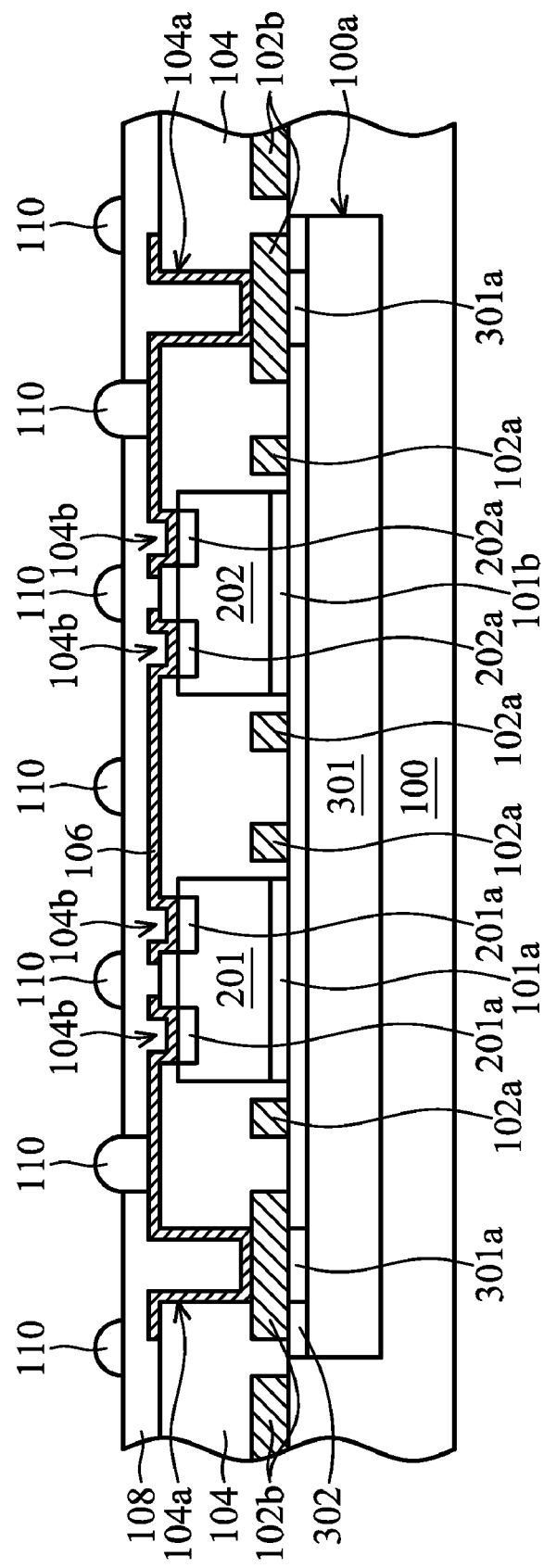

Referring to FIG. 5F, the fill material layer 104 and the redistribution layer 106 are covered by a protective layer 108, such as a solder mask. Next, a plurality of openings is formed in the protective layer 108 to expose the underlying portions of the redistribution layer 106 corresponding thereto. Next, a plurality of conductive bumps 110 is correspondingly formed in the plurality of openings in the protective layer 108, such that the plurality of conductive bumps 110 is electrically connected to the semiconductor chips 201 and 202 through the redistribution layer 106.

Thereafter, the carrier substrate 100 may be polished to a desired thickness and then the carrier substrate 100 and the overlying fill material and protective layers 104 and 108 are diced to form individual chip packages, as shown in FIG. 3.

According to the aforementioned embodiments, since the semiconductor chip can be precisely fixed on the carrier substrate or other semiconductor chip by the position structure, the positing precision for the multiple semiconductor chips can be increased, thereby reducing the difficulty for semiconductor packaging. Moreover, since a redistribution layer and a position structure are between the carrier substrate and the fill material layer, the volume of the fill material layer can be reduced to reduce the stress induced by curing the fill material layer, thereby increasing process stability.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a carrier substrate;
   at least two semiconductor chips disposed on the carrier substrate, wherein each semiconductor chip comprises a plurality of conductive pads;
   a position structure disposed on the carrier substrate to fix locations of the semiconductor chips at the carrier substrate;
   a fill material layer formed on the carrier substrate and covering the semiconductor chips and the position structure, wherein the fill material layer has a plurality of first openings correspondingly exposing the plurality of conductive pads;
   a first redistribution layer disposed on the fill material layer and electrically connected to the plurality of conductive pads through the plurality of first openings;
   a protective layer covering the fill material layer and the first redistribution layer; and
   a plurality of conductive bumps disposed on the protective layer and electrically connected to the first redistribution layer.

2. The chip package of claim 1, further comprising a second redistribution layer between the carrier substrate and the fill material layer.

3. The chip package of claim 2, wherein the fill material layer has a plurality of second openings exposing portions of the second redistribution layer, and the first redistribution layer is electrically connected to the second redistribution layer through the plurality of second openings.

4. The chip package of claim 2, wherein the position structure and the second redistribution layer are formed of the same metal layer to simultaneously serve as a stress buffer layer.

5. The chip package of claim 1, wherein the position structure comprises a transparent or opaque insulating material.

6. The chip package of claim 1, wherein the position structure comprises a plurality of islands adjacent to at least two opposite corners, opposite sides or adjacent sides of each semiconductor chip.

7. The chip package of claim 1, wherein the position structure comprises two rings surrounding the semiconductor chips, respectively.

8. A chip package, comprising:
   a first semiconductor chip comprising a plurality of first conductive pads;
   at least one second semiconductor chip disposed on the first semiconductor chip, wherein the second semiconductor chip comprises a plurality of second conductive pads;
   a position structure disposed on the first semiconductor chip to fix a location of the second semiconductor chip at the first semiconductor chip;
   a first redistribution layer disposed on the first semiconductor chip and electrically connected to the plurality of first conductive pads;
   a fill material layer formed on the first semiconductor chip and covering the second semiconductor chip, the position structure, and the first redistribution layer, wherein the fill material layer has a plurality of first openings correspondingly exposing the plurality of second conductive pads and has a plurality of second openings correspondingly exposing portions of the first redistribution layer;
   a second redistribution layer disposed on the fill material layer, electrically connected to the plurality of second conductive pads through the plurality of first openings, and electrically connected to the first redistribution layer through the plurality of second openings;
   a protective layer covering the fill material layer and the second redistribution layer; and
   a plurality of conductive bumps disposed on the protective layer and electrically connected to the second redistribution layer.

9. The chip package of claim 8, wherein the position structure and the first redistribution layer are formed of the same metal layer to simultaneously serve as a stress buffer layer.

10. The chip package of claim 8, wherein the position structure comprises a transparent or opaque insulating material.

11. The chip package of claim 8, wherein the position structure comprises a plurality of islands adjacent to at least two opposite corners, opposite sides or adjacent sides of the second semiconductor chip.

12. The chip package of claim 8, wherein the position structure comprises at least one ring surrounding the second semiconductor chip.

13. The chip package of claim 8, further comprising a carrier substrate having a cavity on a surface thereof, such that the first semiconductor chip is embedded into the carrier substrate through the cavity.

14. A method for fabricating a chip package, comprising:
   providing a carrier substrate;
   forming a position structure on the carrier substrate;
   providing at least two semiconductor chips on the carrier substrate and fixing locations of the semiconductor chips at the carrier substrate through the position structure, wherein each semiconductor chip comprises a plurality of conductive pads;
   forming a fill material layer on the carrier substrate to cover the semiconductor chip and the position structure, wherein the fill material layer has a plurality of first opening correspondingly exposing the plurality of conductive pads;

forming a first redistribution layer on the fill material layer, such that the first redistribution layer is electrically connected to the plurality of conductive pads through the plurality of first openings;

covering the fill material layer and the first redistribution layer with a protective layer; and forming a plurality of conductive bumps on the protective layer to be electrically connected to the first redistribution layer.

15. The method of claim 14, further forming a second redistribution layer between the carrier substrate and the fill material layer.

16. The method of claim 15, wherein the fill material layer has a plurality of second openings exposing portions of the second redistribution layer, and the first redistribution layer is electrically connected to the second redistribution layer through the plurality of second openings.

17. The method of claim 15, wherein the position structure and the second redistribution layer are formed of the same metal layer to simultaneously serve as a stress buffer layer.

18. The method of claim 14, wherein the position structure comprises a transparent or opaque insulating material.

19. The method of claim 14, wherein the position structure comprises a plurality of islands adjacent to at least two opposite corners, opposite sides or adjacent sides of each semiconductor chip.

20. The method of claim 14, wherein the position structure comprises two rings surrounding the semiconductor chips, respectively.

21. A method for fabricating a chip package, comprising:

providing a first semiconductor chip comprising a plurality of first conductive pads;

forming a position structure and a first redistribution layer on the first semiconductor chip, wherein the first redistribution layer is electrically connected to the plurality of first conductive pads;

providing at least one second semiconductor chip on the first semiconductor chip to fix a location of the second semiconductor chip at the first semiconductor chip through the position structure, wherein the second semiconductor chip comprises a plurality of second conductive pads;

forming a fill material layer formed on the first semiconductor chip to cover the second semiconductor chip, the position structure, and the first redistribution layer, wherein the fill material layer has a plurality of first openings correspondingly exposing the plurality of second conductive pads and has a plurality of second openings correspondingly exposing portions of the first redistribution layer;

forming a second redistribution layer on the fill material layer, such that the second redistribution layer is electrically connected to the plurality of second conductive pads through the plurality of first openings and is electrically connected to the first redistribution layer through the plurality of second openings;

covering the fill material layer and the second redistribution layer with a protective layer; and forming a plurality of conductive bumps on the protective layer to be electrically connected to the second redistribution layer.

22. The method of claim 21, wherein the position structure and the first redistribution layer are formed of the same metal layer to simultaneously serve as a stress buffer layer.

23. The method of claim 21, wherein the position structure comprises a transparent or opaque insulating material.

24. The method of claim 21, wherein the position structure comprises a plurality of islands adjacent to at least two opposite corners, opposite sides or adjacent sides of the second semiconductor chip.

25. The method of claim 21, wherein the position structure comprises at least one ring surrounding the second semiconductor chip.

26. The method of claim 21, further providing a carrier substrate having a cavity on a surface thereof, to embed the first semiconductor chip into the carrier substrate through the cavity.

* * * * *